(12) United States Patent
Rusakovich

(10) Patent No.: US 11,646,091 B2
(45) Date of Patent: May 9, 2023

(54) SYSTEM FOR OUTPUTTING TEST DATA FROM MULTIPLE CORES AND METHOD THEREOF

(71) Applicant: SK hynix inc., Gyeonggi-do (KR)

(72) Inventor: Siarhei Rusakovich, Minsk (BY)

(73) Assignee: SK hynix Inc., Gyeonggi-do (KR)

( * ) Notice: Subject to any disclaimer, the term of this patent is extended or adjusted under 35 U.S.C. 154(b) by 45 days.

(21) Appl. No.: 17/482,151

(22) Filed: Sep. 22, 2021

(65) Prior Publication Data

US 2023/0092302 A1   Mar. 23, 2023

(51) Int. Cl.
| | |
|---|---|
| *G11C 29/10* | (2006.01) |
| *G11C 29/36* | (2006.01) |
| *G11C 29/44* | (2006.01) |
| *G11C 7/10* | (2006.01) |
| *G11C 29/14* | (2006.01) |

(52) U.S. Cl.
CPC ............ *G11C 29/36* (2013.01); *G11C 7/1039* (2013.01); *G11C 29/10* (2013.01); *G11C 29/14* (2013.01); *G11C 29/4401* (2013.01)

(58) Field of Classification Search
CPC ....... G11C 29/36; G11C 7/1039; G11C 29/10; G11C 29/14; G11C 29/4401
See application file for complete search history.

(56) References Cited

U.S. PATENT DOCUMENTS

| | | | |
|---|---|---|---|
| 10,528,404 B2 | 1/2020 | Chen et al. | |
| 2018/0107594 A1* | 4/2018 | Lee ..................... | G06F 12/1027 |
| 2020/0110557 A1 | 4/2020 | Foo | |
| 2022/0147276 A1* | 5/2022 | Watanabe ............. | G06F 3/0604 |

\* cited by examiner

*Primary Examiner* — Mohammed A Bashar
(74) *Attorney, Agent, or Firm* — IP &T Group LLP

(57) ABSTRACT

A system for outputting test data from cores to one communication interface. The system includes shared memories corresponding to the cores. Each shared memory includes a ring buffer and an array of slots. Each core generates a diagnostic message, and stores the generated diagnostic message in a select memory region of the ring buffer corresponding to a first empty slot of the array of slots. A selected core finds a first diagnostic message among diagnostic messages stored in the shared memories, and outputs the first diagnostic message to a personal computer through the communication interface.

20 Claims, 10 Drawing Sheets

SYSTEM FOR OUTPUTTING TEST DATA FROM MULTIPLE CORES AND METHOD THEREOF

BACKGROUND

1. Field

Embodiments of the present disclosure relate to a test system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since the memory devices have no moving parts. Examples of memory systems having such advantages include universal serial bus (USB) memory devices, memory cards having various interfaces such as a universal flash storage (UFS), and solid state drives (SSDs). Memory systems may be tested using various test tools.

SUMMARY

Aspects of the present invention include a system for outputting test data from multiple cores, which are concurrently accessed, to one communication interface without high delays and a method thereof.

In one aspect of the present invention, a test system includes a personal computer configured to transmit a test command; and a testing device including: a communication interface coupled to the personal computer and configured to receive the test command from the personal computer; a plurality of cores concurrently accessed in response to the test command, each core configured to receive the test command from the communication interface and perform a test on multiple memory blocks associated with each core in response to the test command; and a plurality of shared memories corresponding to the plurality of cores, each shared memory including a ring buffer and an array of slots. Each of the plurality of cores is configured to: generate a diagnostic message associated with the test; determine whether a) there is one or more empty slots in the array of slots and b) there is one or more free memory regions in the ring buffer; and when it is determined that a) there is one or more empty slots in the array of slots and b) there is one or more free memory regions in the ring buffer, store the generated diagnostic message in a memory region selected from among the one or more free memory regions, the selected memory region corresponding to a first empty slot among the one or more empty slots. A core selected from among the plurality of cores is configured to: find a first diagnostic message among a plurality of diagnostic messages stored in the plurality of shared memories, and output the first diagnostic message to the personal computer through the communication interface.

In another aspect of the present invention, a method for operating a test system is provided. The test system may include a personal computer and a testing device including a) a communication interface for receiving a test command from the personal computer, and b) a plurality of cores concurrently accessed in response to the test command to perform a test on multiple memory blocks. The method may include: providing a plurality of shared memories corresponding to the plurality of cores, each shared memory including a ring buffer and an array of slots; generating, by each of the plurality of cores, a diagnostic message associated with the test; determining, by each of the plurality of cores, whether a) there is one or more empty slots in the array of slots, and b) there is one or more memory free regions in the ring buffer; storing, by each of the plurality of cores, the generated diagnostic message in a memory region selected from among the one or more free memory regions when it is determined that a) there is one or more empty slots in the array of slots and b) there is one or more free memory regions in the ring buffer, the selected memory region corresponding to a first empty slot among the one or more empty slots; finding, by a core selected from among the plurality of cores, a first diagnostic message among a plurality of diagnostic messages stored in the plurality of shared memories; and outputting, by the selected core, the first diagnostic message to the personal computer through the communication interface.

Additional aspects of the present invention will become apparent from the following description.

DETAILED DESCRIPTION

Figure 1:
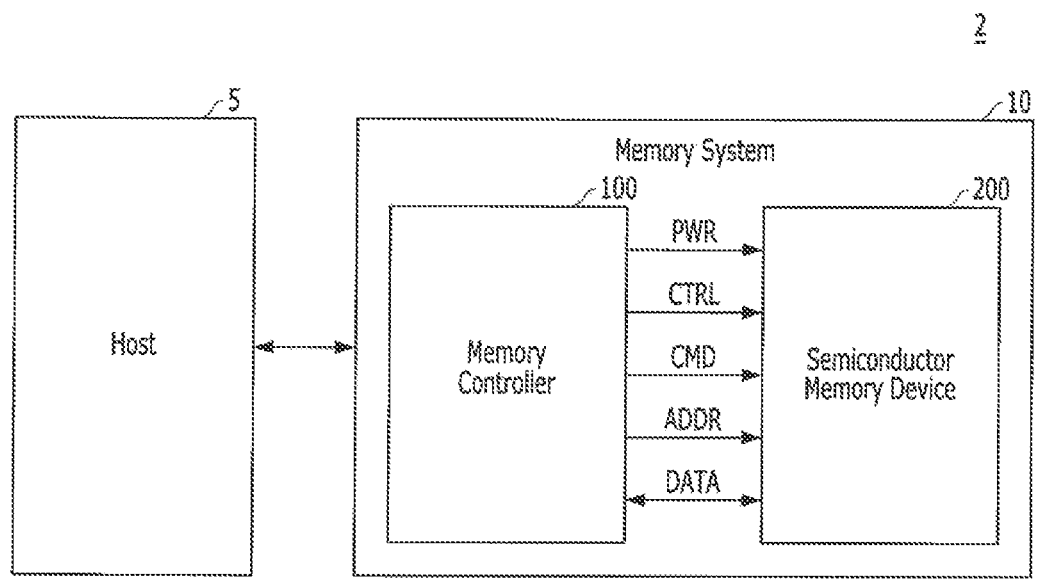
FIG. 1 is a block diagram illustrating a data processing system in accordance with one embodiment of the present invention.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout the disclosure, like reference numerals refer to like parts in the figures and embodiments of the present invention.

The present invention can be implemented in numerous ways, including such as for example a process; an apparatus; a system; a computer program product embodied on a computer-readable storage medium; and/or a processor, such as a processor suitable for executing instructions stored on and/or provided by a memory coupled to the processor. In this specification, these implementations, or any other form that the present invention may take, may be referred to as techniques. In general, the order of the operations of disclosed processes may be altered within the scope of the present invention. Unless stated otherwise, a component such as a processor or a memory described as being suitable for performing a task may be implemented as a general device or circuit component that is configured or otherwise programmed to perform the task at a given time or as a specific device or as a circuit component that is manufactured or pre-configured or pre-programmed to perform the task. As used herein, the term 'processor' or the like refers to one or more devices, circuits, and/or processing cores suitable for processing data, such as computer program instructions.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described herein, the code or instructions for implementing the operations of the method embodiments may transform the computer, processor, controller, or other signal processing device into a special-purpose processor for performing any one of the methods herein.

If implemented at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

A detailed description of various embodiments of the present invention is provided below along with accompanying figures that illustrate aspects of the present invention. The present invention is described in connection with such embodiments, but the present invention is not limited to any specific embodiment. The present invention encompasses numerous alternatives, modifications and equivalents. Numerous specific details are set forth in the following description in order to provide a thorough understanding of the present invention. These details are provided for the purpose of example; the present invention may be practiced without some or all of these specific details. For clarity, technical material that is known in technical fields related to the present invention has not been described in detail so that the present invention is not unnecessarily obscured.

FIG. 1 is a block diagram illustrating a data processing system 2 in accordance with one embodiment of the present invention.

Referring FIG. 1, the data processing system 2 may include a host device 5 and a memory system 10. The memory system may receive a request from the host device 5 and operate in response to the received request. For example, the memory system may store data to be accessed by the host device 5.

The host device 5 may be implemented with any of various types of electronic devices. In various embodiments, the host device may be an electronic device such as for example a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may be a portable electronic device such as for example a mobile phone, a smart phone, an e-book, an MP3 player, a portable multimedia player (PMP), and/or a portable game player.

The memory system 10 may be implemented with any of various types of storage devices such as a solid state drive (SSD) and a memory card. In various embodiments, the memory system 10 may be provided as one of various components in an electronic device such as for example a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. As shown in FIG. 1, the semiconductor memory device 200 may receive through input/output lines a command CMD, an address ADDR and data DATA. The semiconductor memory device 200 may receive power PWR through a power line and a control signal CTRL through a control line. The control signal CTRL may include for example a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. In one embodiment of the invention, where the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC) card, and/or a universal flash storage (UFS).

Figure 2:
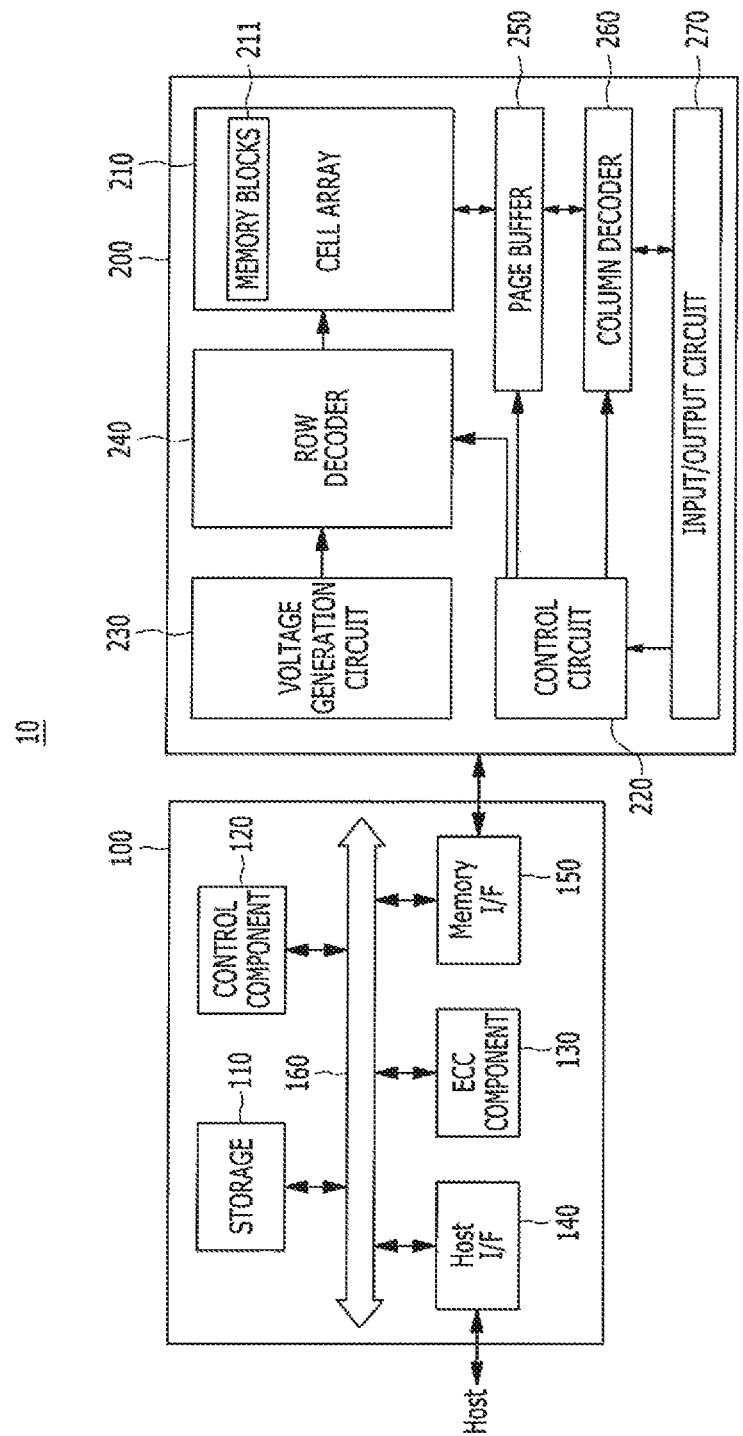
FIG. 2 is a block diagram illustrating a memory system in accordance with another embodiment of the present invention.

FIG. 2 is a block diagram illustrating a memory system in accordance with one embodiment of the present invention. For example, the memory system of FIG. 2 may depict the memory system shown in FIG. 1.

Referring to FIG. 2, the memory system 10 may include a memory controller 100 and a semiconductor memory device 200. The memory system 10 may operate in response to a request from a host device (e.g., a request from host device 5 of FIG. 1), and in particular, store data to be accessed by the host device.

The memory device 200 may store data to be accessed by the host device.

The memory device 200 may be implemented with a volatile memory device such as for example a dynamic random access memory (DRAM) and/or a static random access memory (SRAM) or a non-volatile memory device such as for example a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120 which may be implemented as a processor such as for example a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and the storage 110 may store data for driving the memory system 10 and the controller 100. For example, when the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include for example a program memory, a data memory, a write buffer, a read buffer, a map buffer, and the like.

The control component 120 may control general operations of the memory system 10, and a write operation or a read operation for the memory device 200 in response to a write request or a read request from a host device. The control component 120 may drive firmware or other program instructions, which can be referred to as a flash translation layer (FTL), to control operations of the memory system 10. For example, the FTL may perform operations such as for example logical-to-physical (L2P) mapping, wear leveling, garbage collection, and/or bad block handling. The L2P mapping is known as logical block addressing (LBA).

The ECC component 130 may detect and correct errors in the data read from the memory device 200 during a read operation. In one embodiment, the ECC component 130 may not correct error bits when the number of the error bits is greater than or equal to a threshold number of correctable error bits, but instead may output an error correction fail signal indicating failure in correcting the error bits.

In various embodiments, the ECC component 130 may perform an error correction operation based on a coded modulation such as for example a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices suitable for error correction operation.

The host interface 140 may communicate with the host device through one or more of various communication standards or interfaces such as for example a universal serial bus (USB), a multimedia card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from a host device. The memory interface 150 may generate control signals for the memory device 200 and process data under the control of the control component 120. In one embodiment where the memory device 200 is a flash memory such as a NAND flash memory, the memory interface 150 may generate control signals for the memory and process data under the control of the control component 120.

The memory device 200 as shown for example in FIG. 2 may include a memory cell array 210, a control circuit 220, a voltage generation circuit 230, a row decoder 240, a page buffer 250 which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform program, read, or erase operations of the memory cell array 210. The control circuit 220 may control the peripheral circuit.

The voltage generation circuit 230 may generate operational voltages of various levels. For example, in an erase operation, the voltage generation circuit 230 may generate operational voltages of various levels such as for example an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operational voltages supplied from the voltage generation circuit 230 to the selected memory blocks.

Figure 3:
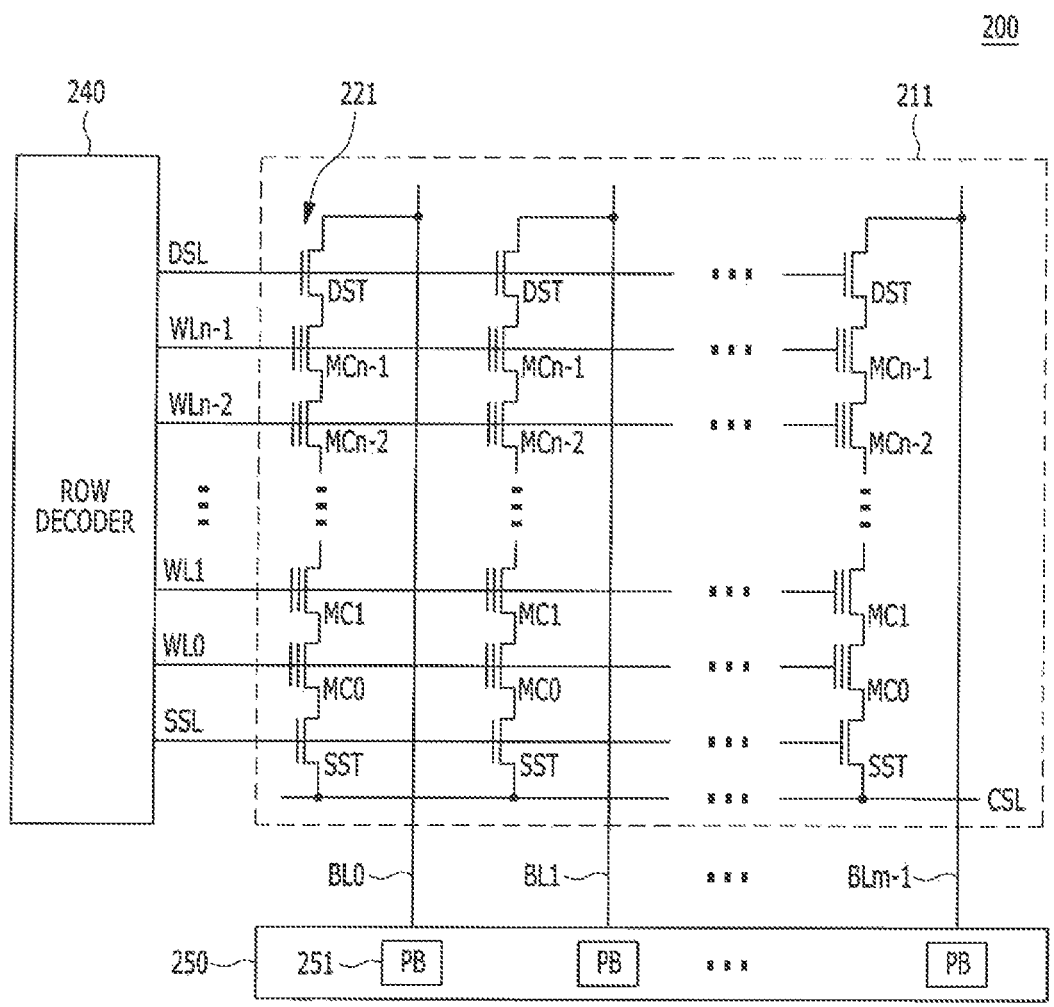
FIG. 3 is a circuit diagram illustrating a memory block of a memory device in accordance with still another embodiment of the present invention.

The page buffer 250 may be coupled with the memory cell array 210 through bit lines BL (shown in FIG. 3). The page buffer 250 may precharge the bit lines BL with a positive voltage, transmit data to and receive data from, a selected memory block in program and read operations, or temporarily store transmitted data in response to page buffer control signal(s) generated by the control circuit 220.

The column decoder 260 may transmit data to and receive data from the page buffer 250, or may transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device.

The control circuit 220 may control one of the peripheral circuits in response to the command and the address.

FIG. 3 is a circuit diagram illustrating a memory block of a semiconductor memory device 200 in accordance with one embodiment of the present invention. For example, the memory block of FIG. 3 may be any of the memory blocks 211 of the memory cell array 210 in the semiconductor memory device 200 shown in FIG. 2.

Referring to FIG. 3, the memory block 211 may include a plurality of word lines WL0 to WLn−1, a drain select line DSL and a source select line SSL coupled to the row decoder 240. These lines may be arranged in parallel, with the plurality of word lines between the DSL and SSL.

The memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or a verify operation.

In various embodiments of the present invention, the memory blocks 211 may include a NAND-type flash memory cell. However, the memory blocks 211 are not limited to such cell type, and may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
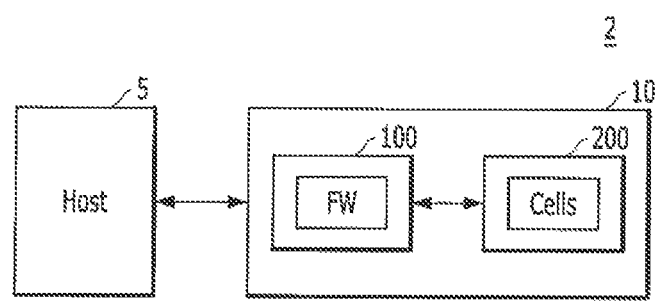
FIG. 4 is a diagram illustrating distributions of states for different types of cells of a memory device in accordance with one embodiment of the present invention.

FIG. 4 is a diagram illustrating a data processing system 2 in accordance with one embodiment of the present invention.

Referring to FIG. 4, the data processing system 2 may include a host 5 and a memory system (i.e., a storage device) 10. The storage device 10 may include a controller 100 and a memory device 200. The memory device 200 may include a plurality of memory cells (e.g., NAND flash memory cells). The memory cells are arranged in an array of rows and columns as shown in FIG. 3. The cells in a particular row are connected to a word line (e.g., WL0), while the cells in a particular column are coupled to a bit line (e.g., BL0). These word and bit lines are used for read and write operations. During a write operation, the data to be written ('1' or '0') is provided at the bit line while the word line is addressed. During a read operation, the word line is again addressed, and the threshold voltage of each cell can then be acquired from the bit line. Multiple pages may share the memory cells that belong to (i.e., are coupled to) the same word line.

The controller 100 may include firmware (FW) which is a specific class of software for controlling various operations (e.g., read, write, and erase operations) for the memory device 200. In some embodiments, the firmware may reside in the storage 110 and may be executed by the control component 120, in FIG. 2.

The firmware may include a host interface layer (HIL) controlling communication with the host 5, a flash translation layer (FTL) controlling communication between the host 5 and the memory device 200, and a flash interface layer (FIL) controlling communication with the memory device 200. FTL is the most complex part of the firmware.

The storage device 10 such as a solid state drive (SSD) may include the controller 100 implemented with multiple cores. These multicore systems may include one communication interface with an external test device for testing, i.e., logging and diagnostic purposes. In most cases, a slow transmission (or output) interface as the communication interface may be used to enable printing (or transmitting) to the test device. The output interface may be implemented with a universal asynchronous receiver and transmitter (UART), serial (or single) wire output (SWO), etc.

When the output interface is used for concurrent access of multiple cores, there are some issues as following.

A first issue is that in most cases, the output interface does not arbitrate or support queueing of data output from multiple sources. In combination with the concurrent access from several cores, this will lead to the overlapping of messages from different cores during the data output. Actually, the resource of the output interface, i.e., the output components of the size equal to an output buffer (e.g., an 8-byte buffer) of the output interface, should be distributed on several cores. This distribution may depend on the implementation of mutexes (that is one of more mutual exclusion objects to synchronize/control data access) within the mutexes output interface and a capture algorithm of the mutexes. With the exclusive capture of the output interface mutex for the entire duration of the message output from one core, other cores may be necessary to output diagnostic messages. In this case, the other cores may not be able to output the diagnostic messages because they will be trying to capture the mutex. A periodic check of a mutex while performing other tasks in parallel may lead to the loss of the data that were not output to the output interface, because new ones may arrive.

A second issue is the output of diagnostic messages from modes with a higher priority, such as interrupts or exception handlers. For example, the output to the output interface from the interrupt mode can interrupt the output to the output interface from the user mode. That is, the execution of the interrupt handler with a higher priority may block the execution of interrupts with a lower priority.

A third issue is that the output to the output interface does not necessarily occur in the order of the start time of the message output, but may occur in the order of the capture of the output interface mutex. With minimal delays between messages on different cores, there is no possibility to determine which message went to transmit first because of waiting for the capture of the output interface mutex and, possibly, continuing output on other cores. This may reduce the value of the output diagnostic messages.

A fourth issue is that diagnostic data (or messages) outputs are quite slow. Generally, preparing and displaying a diagnostic message will block the process of executing the main program for a long time. Taking into account the high speeds of processing in modern system on chip (SoC) cores, this can lead to the impossibility of using such channels of SoC cores, for example, due to the strong influence on the timings of critical tasks executed in the main program. For example, at a speed of 115200 baud for UART, the output of one character takes about 87 microseconds. The internal UART output buffers are not large and usually do not allow filling more than 8 to 32 bytes (characters) at a time. Furthermore, it will take rather a long time for the cores to constantly check that the UART output buffer is empty for its further filling. Besides, it will take time to capture the exclusive access mutex. All this can affect the execution of the main program and lead to rather high delays. For example, for a message of 80 characters with the simplest solution, it will take 6.264 milliseconds to output to a UART with an 8-byte buffer. This is exactly the time that will be taken from processing data in the main program.

Accordingly, various embodiments of the present invention can provide a scheme for effectively outputting test data (i.e., diagnostic data) from multiple cores, which are concurrently accessed, to one communication interface without high delays.

Figure 5:
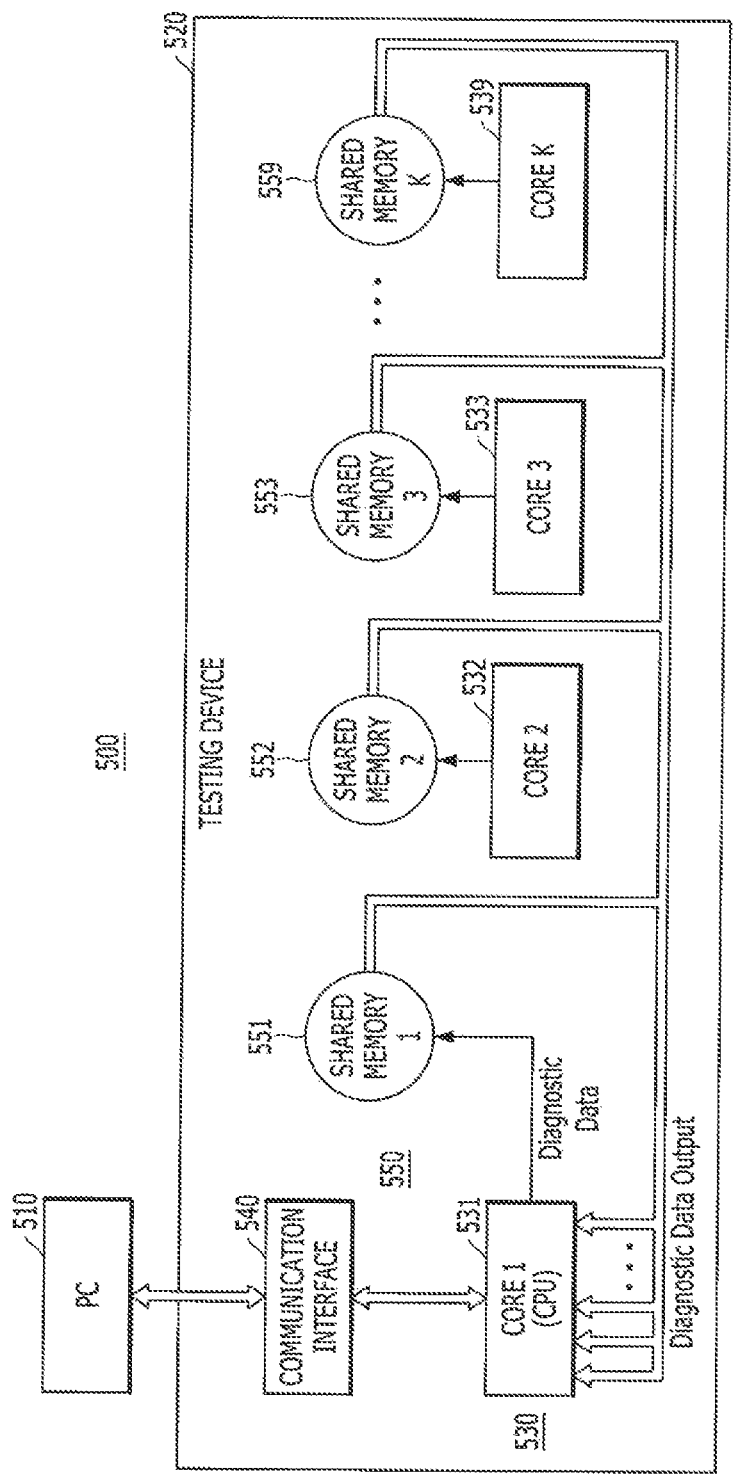
FIG. 5 is a diagram illustrating a test system for a multicore storage device in accordance with another embodiment of the present invention.

FIG. 5 is a diagram illustrating a test system 500 for a multicore storage device in accordance with one embodiment of the present invention.

Referring to FIG. 5, the test system 500 may include a personal computer (PC) 510 and a testing device 520. The personal computer 510 may test the testing device 520 and collect diagnostic data (or test data) from the testing device 520. For example, the personal computer 510 may be the host 5 and the testing device 520 may be the memory system 10, as shown in FIG. 4.

In various embodiments, the testing device 520 may be a multicore storage device (or a multicore memory system) such as a multicore solid state drive (SSD). The testing device 520 may include a plurality of cores 530, a communication interface 540 and a plurality of shared memories 550. In the illustrated example of FIG. 5, the plurality of cores 530 may include a first core CORE 1 531 to a K-the core CORE K 539. Each core may be implemented with a central processing unit (CPU).

The communication interface 540 may receive a test command from the personal computer 510 and transmit the test command to the plurality of cores 530. That is, the test command may be a command for concurrent accessing and testing all of the plurality cores 530. Alternatively, the test command may be a command for accessing and testing one or more cores selected from among the plurality cores 530. In various embodiments, the communication interface 530 may be implemented with a universal asynchronous receiver and transmitter (UART).

Each core may receive the test command through the communication interface 540 and perform a particular test in response to the test command. For example, each core may be associated with a plurality of memory blocks, e.g., memory blocks in the memory device 200 of FIG. 4 and perform a test on the plurality of memory blocks. As the test result, each core may generate diagnostic data and provide the diagnostic data to a corresponding shared memory among the plurality of shared memories 550.

The plurality of shared memories 550 may include a first shared memory 551 to a K-th shared memory 559. In the illustrated example of FIG. 5, the first shared memory 551 to the K-th shared memory 559 may correspond to the first core CORE 1 531 to the K-the core CORE K 539, respectively. That is, the number of the plurality of shared memories 550 may be the same as the number of the plurality of cores 530.

Figure 6:
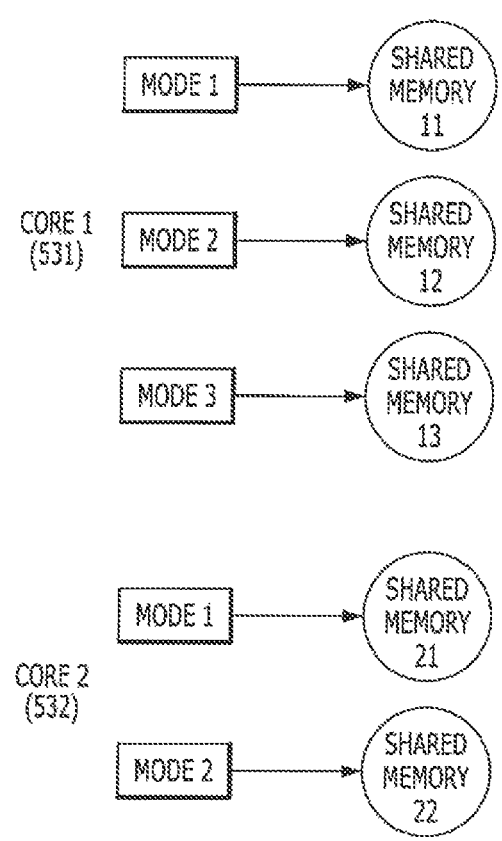
FIG. 6 is a diagram illustrating an implementation of shared memories corresponding to modes of each core in a test system in accordance with still another embodiment of the present invention.

Alternatively, the number of the plurality of shared memories 550 may be determined based on the number of the plurality of cores 530 and the number of execution modes supported by each core. In various embodiments, each execution mode may include any of user, interrupt, supervisor and other modes related to an architecture of CPU. If a core (i.e., CPU) has few execution modes which should be processed separately, the execution modes can function as separated cores. In other words, in one embodiment of the present invention, each execution mode is present as a separate CPU with its own structure and processing. In the illustrated example of FIG. 6, the first core 531 may support three execution modes, and there are three shared memories 11 to 13 corresponding to the three execution modes. The second core 532 may support two execution modes, and there are two shared memories 21 to 22 corresponding to the two execution modes.

Figure 7:
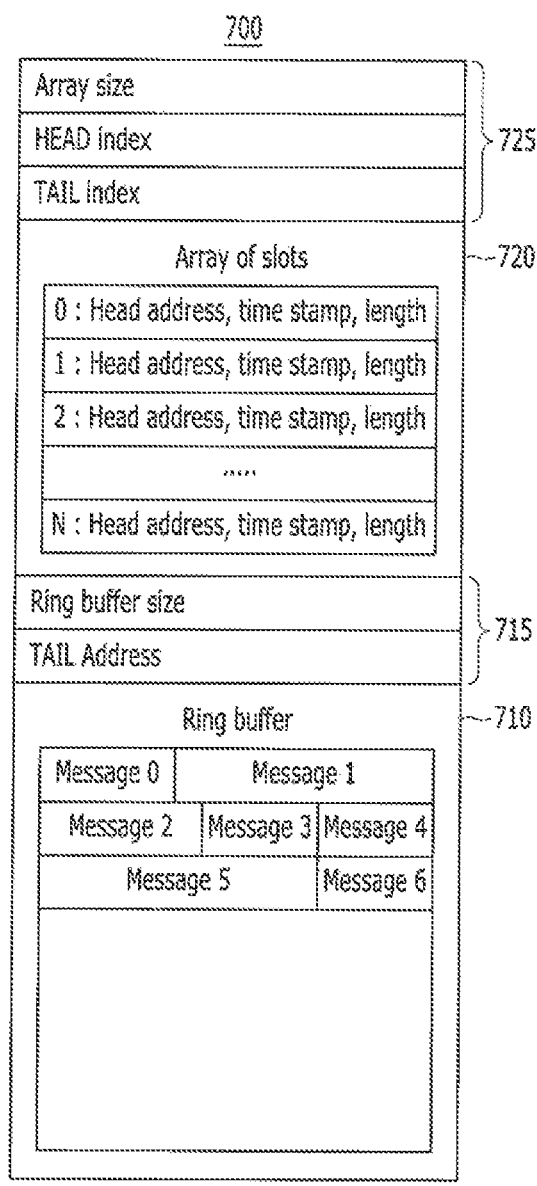
FIG. 7 is a diagram illustrating a structure of a shared memory in accordance with one embodiment of the present invention.

Each shared memory 700 may include a ring buffer 710 and an array of slots 720 as shown in FIG. 7. Details of each shared memory are described below.

Each of the plurality of cores 530 may perform a particular test (e.g., black box, white box and unit tests) and generate diagnostic data associated with the test. That is, each of the plurality of cores 530 may be a producer (builder) of diagnostic data. Further, each core may determine whether there is one or more empty slots in the array of slots 720, and may determine whether there is one or more memory regions in the ring buffer 710. When it is determined that there is one or more empty slots in the array of slots 720 and that there is one or more free memory regions in the ring buffer 710, each core may store the generated diagnostic data in a memory region selected from among the one or more free memory regions. The selected memory region may correspond to a first empty slot among the one or more empty slots.

A core may be selected from among the plurality of cores 530. The selected core may find a first diagnostic message among a plurality of diagnostic messages stored in the plurality of shared memories 530 and output the first diagnostic message to the personal computer 510 through the communication interface 540. In various embodiments, the selected core may be a least loaded core (a core with the least amount of stored data) among the plurality of cores 530. In the illustrated example of FIG. 5, the first core 531 may be selected from among the plurality of cores 530.

As noted above, diagnostic data may be output to the communication interface 540 through the shared memories 550, not directly to the communication interface 540. The shared memories 550 may be accessed by the core (e.g., the first core 531 of FIG. 5) which directly interacts with the communication interface 540 and outputs the diagnostic data. That is, during the output of diagnostic data, instead of exclusive capture of the diagnostic data at the communication interface 540, the testing device 520 may use the output to the shared memories 550. The shared memories 550 may not be globally shared, but may be shared between a core functioning as a diagnostic data output controller (i.e., the selected core) and cores functioning as a diagnostic data producer (i.e., all cores).

FIG. 7 is a diagram illustrating a structure of a shared memory 700 in accordance with another embodiment of the present invention. The shared memory 700 may be each of the plurality of shared memories 550 in FIG. 5. Building of diagnostic data, i.e., generating (producing) of the diagnostic data and storing of the diagnostic data in the shared memory 700 may be performed by each core in FIG. 5.

Referring to FIG. 7, as noted above, the shared memory 700 may include the ring buffer 710 and the array of slots 720. Further, the shared memory 700 may include a region 715 and a region 725. Each core of FIG. 5 may generate diagnostic data (i.e., diagnostic messages) and store the generated diagnostic data in the ring buffer 710. Each core may generate header information associated with the diagnostic data and store the generated header information in the array of slots 720. Each core may generate buffer information regarding the ring buffer 710 and store the generated buffer information in the region 715. Each core may generate array information regarding the array of slots 720 and store the generated array information in the region 725.

The ring buffer 710 may include multiple memory regions for storing diagnostic data, i.e., a plurality of diagnostic messages. In the illustrated example of FIG. 7, the ring buffer 710 may store seven diagnostic messages including a zeroth diagnostic message Message0 to a sixth diagnostic message Message6.

The array of slots 720 may include multiple slots corresponding to the multiple memory regions of the ring buffer 710. In the illustrated example of FIG. 7, the array of slots 720 may include (N+1) slots including a zeroth slot with index 0 to an Nth slot with index N. For example, the zeroth slot may correspond to the zeroth diagnostic message Message0, a first slot may correspond to a first diagnostic message Message1 and a second slot may correspond to a second diagnostic message Message2.

Each of the array of slots 720 may store header information for a diagnostic message. In various embodiments, the header information may include a head address, a timestamp and length information. The head address may indicate a particular memory region among the multiple memory regions of the ring buffer 710 in which the diagnostic message is stored. The timestamp may indicate a time at which the diagnostic message is stored in the particular memory region. The length information may be information regarding a length of the diagnostic message.

Array information may include head index, tail index associated with the array of slots, and size information. The head index may indicate a first slot in the array of slots 720, and the tail index may indicate a first empty slot in the array of slots 720. The size information may be information regarding a size of the array of slots 720.

Buffer information may include a tail address indicating a first empty place in the ring buffer 710 and size information regarding a size of the ring buffer 710.

Referring back to FIG. 5, the selected core among the plurality of cores 530, i.e., the first core 531 may find a first diagnostic message among a plurality of diagnostic messages stored in the plurality of shared memories 530. Further, the first core 531 may output the first diagnostic message to the personal computer 510 through the communication interface 540. For example, the first core 531 may find a first diagnostic message among a plurality of diagnostic messages stored in the ring buffer 710 of each shared memory. The ring buffer 710 may have a state as shown in FIG. 8.

Figure 8:
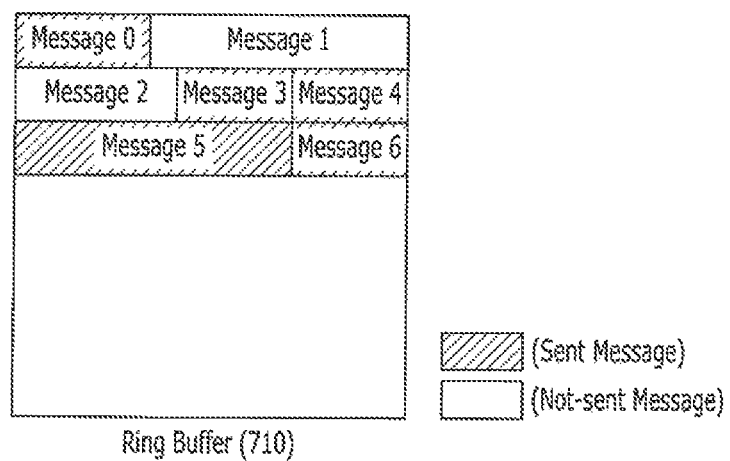
FIG. 8 is a diagram illustrating an example of diagnostic data stored in a ring buffer in accordance with another embodiment of the present invention.

In the illustrated example of FIG. 8, seven diagnostic messages including a zeroth message Message0 to a sixth message Message6 have been stored in the ring buffer 710. Some diagnostic messages may have been output to the communication interface 540 with remaining diagnostic messages still stored in the ring buffer 710. As illustrated in FIG. 8, five diagnostic messages including the zeroth message Message0 and a third message Message3 to the sixth message Message6 are messages which have been sent to the communication interface 540 through previous processing. As illustrated in FIG. 8, two diagnostic messages including a first message Message1 and a second message Message2 are messages which have not been sent to the communication interface 540.

Figure 9:
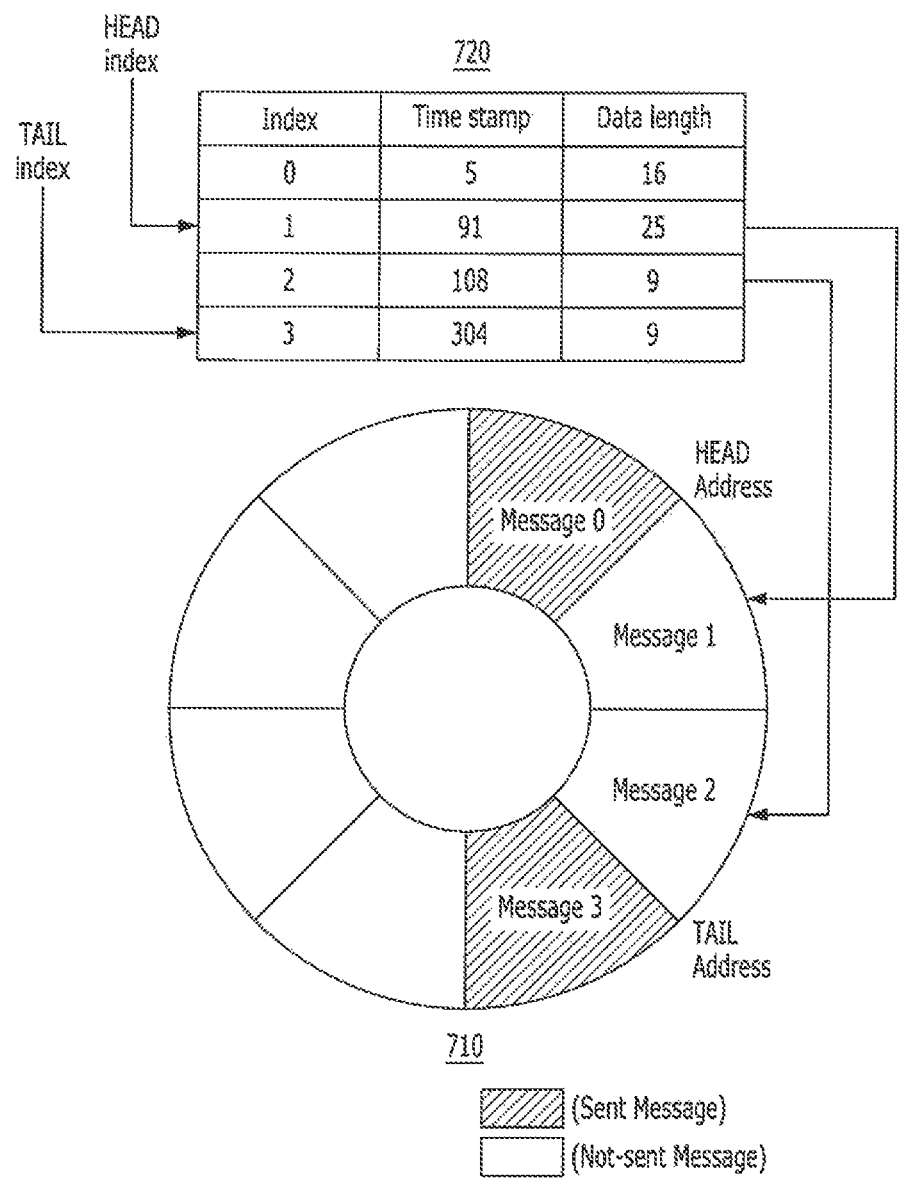
FIG. 9 is a diagram illustrating an example of a ring buffer and an array of slots in accordance with still another embodiment of the present invention.

FIG. 9 is a diagram illustrating an example of a ring buffer 710 and an array of slots 720 in accordance with another embodiment of the present invention.

Referring to FIG. 9, diagnostic messages may be sequentially stored in the ring buffer 710. In the illustrated example of FIG. 9, four diagnostic messages including a zeroth message Message0 to a third message Message3 may be sequentially stored in the ring buffer 710. The diagnostic messages may have the same data length or different data length. A head address and a tail address may be managed for the ring buffer 710. The head address may indicate a position of the ring buffer 710 in which each diagnostic message is stored. That is, the head address may be an offset in the ring buffer 710 to a start position of the corresponding diagnostic message, i.e., offset to a position of a memory region in the ring buffer 710 in which the corresponding diagnostic message is stored. The tail address may indicate a first empty memory region in the ring buffer 710.

Header information associated with each diagnostic message may be generated and stored in each slot of the array of slots 720. Each slot may have an index and store the header information including a timestamp (Time stamp) and length information (Data length). The slot with an index 0 may store a timestamp "5" and a data length "16" for the zeroth message Message0 in the ring buffer 710. The slot with an index 1 may store a timestamp "91" and a data length "25" for the first message Message1 in the ring buffer 710. The slot with an index 2 may store a timestamp "108" and a data length "9" for the second message Message2 in the ring buffer 710. The slot with an index 3 may store a timestamp "304" and a data length "9" for the third message Message3 in the ring buffer 710. A head index and a tail index may be managed for the array of slots 720. The head index may indicate a first slot found in the array of slots 720 upon searching the array of slots 720 in which data is stored and the tail index may indicate a first empty slot found upon searching the array of slots 720.

In various embodiments, the head index and the head address may be not changed during the building (i.e., generating and storing) of one or more diagnostic messages. Head index and address may be changed when one or more diagnostic messages are output to the communication interface 540. Tail index and address may be changed to indicate a position for adding a new diagnostic message.

Among the four diagnostic messages above, as illustrated in FIG. 9, two diagnostic messages including the zeroth message Message0 and the third message Message3 have been sent to the communication interface 540. As illustrated in FIG. 9, the first message Message1 and the second message Message2 still remain in the ring buffer 710 and have not been sent to the communication interface 540.

In this situation, as shown in FIG. 7, the size of the array of slots 720 may be set to N, the head index may be set to 1, which indicates a slot with the index "1" in the array of slots 720, and the tail index may be set to 3, which indicates a first empty (or free) slot, i.e., a slot with the index "3" in the array of slots 720. The head address in the slot with the index "1" may point to an address corresponding to a first byte of the first message Message1 in the ring buffer 710. The head address in the slot with the index "2" may point to an address corresponding to a first byte of the second message Message2 in the ring buffer 710. The tail address in the slot with the index "3" may point to an address corresponding to a first byte following the second message Message2 in the ring buffer 710. That is, the tail address may point to an address corresponding to a sum of the head address of the second message Message2 and the data length of the second message Message2.

In various embodiments, the selected core of FIG. 5 may find a minimum timestamp among timestamps of the header information stored in a plurality of the array of slots 720 in the plurality of shared memories 550. Further, the selected core may find the diagnostic message with the minimum timestamp from the ring buffer 710 and output the found diagnostic message to the communication interface 540.

Referring back to FIG. 5, the plurality of cores 530 may perform test operations (e.g., black box, white box and unit tests) and generate test data (i.e., diagnostic messages) associated with the test operations. In the illustrated example of FIG. 5, a plurality of cores CORE 1 to CORE K may execute diagnostic data generation tasks. Due to diagnostic data generation tasks, diagnostic messages may be generated and stored in the ring buffer 710 of each of the shared memories 550. Further, various information associated with the diagnostic messages may be generated and stored in each shared memory.

The diagnostic data generation tasks may be performed by each of the plurality of cores. First, a core may check head and tail indexes for the array of slots 720 to determine whether there is an empty slot among the array of slots 720. When it is checked that the head index and the tail index are different, the core may determine that there is an empty slot among the array of slots 720.

Second, the core may get a head address for the ring buffer 710 from a slot with the head index in the array of slots 720. Third, the core may check the head address and the tail address for the ring buffer 710 to determine whether there is an empty (free) memory region among multiple memory regions in the ring buffer 710. When it is checked that the head address and the tail address are different, the core may determine that there is an empty memory region in the ring buffer 710.

Fourth, when it is determined that there is an empty memory region in the ring buffer 710, the core may store a new diagnostic message to the empty memory region in the ring buffer 710 which is pointed by the tail address. Fifth, the core may put (store) header information (i.e., a head address, a timestamp and a data length) of the new diagnostic message into the slot of the array of slots 720 pointed by the tail index. Finally, the core may change a tail address for the ring buffer 710 and change the tail index for the array of slots 720.

The diagnostic data output task may be performed by a particular core among the plurality of cores. In one embodiment, the particular core may be one of the less loaded cores (e.g., a least loaded core) among the plurality of cores. In one illustrated example, the particular core may be the first core CORE 1. As such, the diagnostic data generation tasks and the diagnostic data output task do not overlap in time.

For the diagnostic data output task, the particular core may determine a diagnostic message (among the diagnostic messages, which are stored in the ring buffers of the shared memories 550 and pointed by head indexes) to be outputted to the personal computer 510. In one embodiment, the particular core may find a first diagnostic message among diagnostic messages stored in the ring buffers of the shared memories 550 based on the header information (e.g., the timestamp) stored in the array of slots 720. The first diagnostic message may be a diagnostic message with a minimum (or lowest) timestamp among diagnostic messages pointed by head indexes. Further, the particular core may retrieve the diagnostic message with the lowest timestamp (i.e., the first diagnostic message shown in FIG. 9) and output the retrieved diagnostic message to the personal computer 510 through the communication interface 540.

The diagnostic message output task may loop through header information of the array of slots 720 to find the minimum timestamp. Then the diagnostic message output task may output the found diagnostic message to the communication interface 540. When the communication interface 540 includes an internal buffer (e.g., 8 bytes), one or more message chunks, of which size is equal to the size of the internal buffer, may be outputted to the communication interface 540. For example, a chunk of a diagnostic message (e.g., 8 bytes) may be outputted to the communication interface 540. For another example, a chunk of two diagnostic messages (e.g., 2×4 bytes) may be outputted to the communication interface 540.

After completing the output of one or more diagnostic messages, the head index of the array of slots 720 and the head address of the ring buffer 710 may be changed. Positioning to the next diagnostic message to be outputted from the ring buffer 710 or to be stored in the ring buffer 710 may occur automatically due to the head address or the tail address for the ring buffer 710. After that, the operation of finding the minimum timestamp may be repeated, and the next diagnostic message may be outputted to the communication interface 540.

Thus, in one embodiment of the present invention, no migration of the diagnostic message in memory may occur. Synchronization between cores may also be not required because different pointers (i.e., head and tail) change on different cores: the head changes on the core that outputs a diagnostic message to the shared memories 550, and the tail changes on the core that outputs a diagnostic message to the communication interface 540. In the case of checks on the cores, there is no conflict in the ring buffer 710 due to an older tail value.

Figure 10:
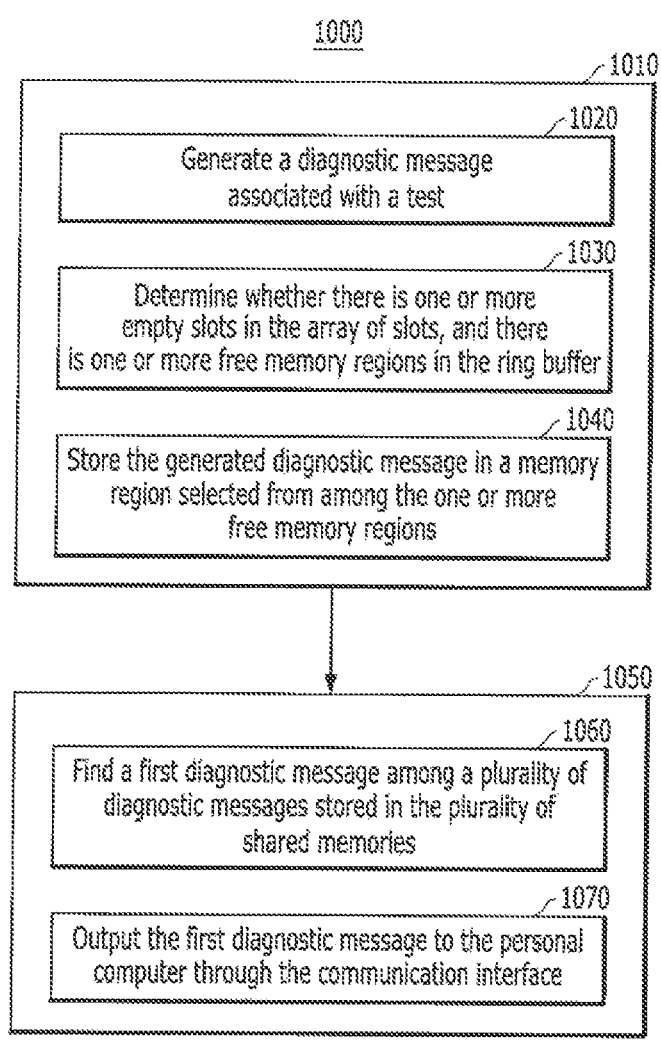
FIG. 10 is a flowchart illustrating a test operation for a multicore storage device in accordance with yet another embodiment of the present invention.

FIG. 10 is a flowchart illustrating a test operation for a multicore storage device in accordance with another embodiment of the present invention. The test operation 1000 may be performed by the test system 500 in FIG. 5. As shown in FIG. 5, the test system 500 may include a personal computer 510 configured to transmit a test command to a testing device 520. The testing device 520 may include a plurality of cores 530 concurrently accessed in response to the test command, a communication interface 540 coupled to the personal computer 510 and configured to receive the test command from the personal computer and a plurality of shared memories 550 corresponding to the number of the plurality of cores 530. Each core may be configured to receive the test command from the communication interface 540 and perform a test (e.g., black box, white box and unit tests) on multiple memory blocks associated with each core in response to the test command. Each shared memory may include a ring buffer 710 and an array of slots 720 as shown in FIG. 7.

Referring to FIG. 10, the test operation 1000 may include a diagnostic data generation (or building) operation 1010 and a diagnostic data output operation 1050. The diagnostic data generation operation 1010 may be performed by each of the plurality of cores, whereas the diagnostic data output operation 1050 may be performed by a particular core selected from among the plurality of cores. In various embodiments, the particular core may be a least loaded core among the selected cores.

The diagnostic data generation operation 1010 may include operations 1020 to 1040. In operation 1020, each of the plurality of cores may generate a diagnostic message associated with the test. In operation 1030, each of the plurality of cores may determine whether there is one or more empty slots in the array of slots, and whether there is one or more memory regions in the ring buffer. In operation 1040, each of the plurality of cores may store the generated diagnostic message in a memory region selected from among the one or more free memory regions when it is determined that there is one or more empty slots in the array of slots and when it is determined that there is one or more free memory regions in the ring buffer. The selected memory region may correspond to a first empty slot among the one or more empty slots.

In various embodiments, each of the plurality of cores may generate header information including a head address indicating a particular memory region among multiple memory regions of the ring buffer in which the diagnostic message is stored and a timestamp indicating a time at which the diagnostic message is stored in the particular memory region, and may store the header information in a particular slot among multiple slots of the array of slots. The header information may further include information regarding a length of the diagnostic message.

In various embodiments, each of the plurality of cores may determine whether there is one or more empty slots in the array of slots based on a head index and a tail index, the head index indicating a first slot in the array of slots and the tail index indicating a first empty slot in the array of slots.

In various embodiments, each of the plurality of cores may generate array information including the head index and the tail index associated with the array of slots, and may store the array information in the shared memory.

In various embodiments, each of the plurality of cores may generate buffer information including a tail address indicating a first empty memory region in the ring buffer, and may store the buffer information in the shared memory.

The diagnostic data output operation 1050 may include operations 1060 to 1070. In operation 1060, the selected core may find a first diagnostic message among a plurality of diagnostic messages stored in the plurality of shared memories 550. In various embodiments, the selected core may find a minimum timestamp among timestamps of the header information stored in a plurality of the array of slots in the plurality of shared memories, and may find the first diagnostic message with the minimum timestamp.

In operation 1070, the selected core may output the first diagnostic message to the personal computer 510 through the communication interface 540.

As described above, various embodiments of the present invention provide a scheme for effectively outputting test data from multiple cores, which are concurrently accessed, to one communication interface without high delays.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives of the disclosed embodiments. Furthermore, the disclosed embodiments may be combined to form additional embodiments.

What is claimed is:

1. A test system comprising:
   a personal computer configured to transmit a test command; and
   a testing device including:
   a communication interface coupled to the personal computer and configured to receive the test command from the personal computer;
   a plurality of cores concurrently accessed in response to the test command, each core configured to receive the test command from the communication interface and perform a test on multiple memory blocks associated with each core in response to the test command; and
   a plurality of shared memories corresponding to the plurality of cores, each shared memory including a ring buffer and an array of slots,
   wherein each of the plurality of cores is configured to:
   generate a diagnostic message associated with the test;
   determine whether a) there is one or more empty slots in the array of slots and b) there is one or more free memory regions in the ring buffer; and
   when it is determined that a) there is one or more empty slots in the array of slots and b) there is one or more free memory regions in the ring buffer, store the generated diagnostic message in a memory region selected from among the one or more free memory regions, the selected memory region corresponding to a first empty slot among the one or more empty slots, and wherein a core selected from among the plurality of cores is configured to: find a first diagnostic message among a plurality of diagnostic messages stored in the plurality of shared memories, and output the first diagnostic message to the personal computer through the communication interface.

2. The test system of claim 1, wherein the ring buffer in each shared memory includes multiple memory regions, and the array of slots in each shared memory includes multiple slots corresponding to the multiple memory regions, and wherein each of the plurality of cores is further configured to:

generate header information including a head address indicating a particular memory region among the multiple memory regions of the ring buffer in which the diagnostic message is stored and a timestamp indicating a time at which the diagnostic message is stored in the particular memory region; and store the header information in a particular slot among multiple slots of the array of slots.

3. The test system of claim 2, wherein the header information further includes information regarding a length of the diagnostic message.

4. The test system of claim 2, wherein each of the plurality of cores is configured to determine whether there is one or more empty slots in the array of slots based on a head index and a tail index, the head index indicating a first slot in the array of slots and the tail index indicating a first empty slot in the array of slots.

5. The test system of claim 4, where each of the plurality of cores is further configured to:

generate array information including the head index and the tail index associated with the array of slots, and store the array information in the shared memory.

6. The test system of claim 5, wherein the array information further includes information regarding a size of the array of slots.

7. The test system of claim 2, wherein each of the plurality of cores is further configured to:

generate buffer information including a tail address indicating a first empty memory region in the ring buffer, and store the buffer information in the shared memory.

8. The test system of claim 7, wherein the buffer information further includes information regarding a size of the ring buffer.

9. The test system of claim 2, wherein the selected core is configured to:

find a minimum timestamp among timestamps of the header information stored in the array of slots in the plurality of shared memories, and find the first diagnostic message with the minimum timestamp.

10. The test system of claim 9, wherein the selected core is a least loaded core among the plurality of cores.

11. The test system of claim 1, wherein a number of the plurality of shared memories is determined based on a number of the plurality of cores and a number of execution modes supported by each core.

12. A method for operating a test system which includes a personal computer and a testing device including a) a communication interface for receiving a test command from the personal computer and b) a plurality of cores concurrently accessed in response to the test command to perform a test on multiple memory blocks, the method comprising:

providing a plurality of shared memories corresponding to the plurality of cores, each shared memory including a ring buffer and an array of slots;

generating, by each of the plurality of cores, a diagnostic message associated with the test;

determining, by each of the plurality of cores, whether a) there is one or more empty slots in the array of slots and b) there is one or more memory free regions in the ring buffer;

storing, by each of the plurality of cores, the generated diagnostic message in a memory region selected from among the one or more free memory regions when it is determined that a) there is one or more empty slots in the array of slots and b) there is one or more free memory regions in the ring buffer, the selected memory region corresponding to a first empty slot among the one or more empty slots;

finding, by a core selected from among the plurality of cores, a first diagnostic message among a plurality of diagnostic messages stored in the plurality of shared memories; and outputting, by the selected core, the first diagnostic message to the personal computer through the communication interface.

13. The method of claim 12, further comprising:

generating, by each of the plurality of cores, header information including a head address indicating a particular memory region among multiple memory regions of the ring buffer in which the diagnostic message is stored and a timestamp indicating a time at which the diagnostic message is stored in the particular memory region; and storing, by each of the plurality of cores, the header information in a particular slot among multiple slots of the array of slots.

14. The method of claim 13, wherein the header information further includes information regarding a length of the diagnostic message.

15. The method of claim 13, wherein the determining whether there is one or more empty slots in the array of slots comprises:

determining whether there is one or more empty slots in the array of slots based on a head index and a tail index, the head index indicating a first slot in the array of slots and the tail index indicating a first empty slot in the array of slots.

16. The method of claim 15, further comprising:

generating, by each of the plurality of cores, array information including the head index and the tail index associated with the array of slots, and storing, by each of the plurality of cores, the array information in the shared memory.

17. The method of claim 13, further comprising:

generating, by each of the plurality of cores, buffer information including a tail address indicating a first empty memory region in the ring buffer; and storing, by each of the plurality of cores, the buffer information in the shared memory.

18. The method of claim 13, wherein the finding the first diagnostic message comprises:

finding a minimum timestamp among timestamps of the header information stored in a plurality of the array of slots in the plurality of shared memories; and finding the first diagnostic message with the minimum timestamp.

19. The method of claim 18, wherein the selected core is a least loaded core among the plurality of cores.

20. The method of claim 12, wherein a number of the plurality of shared memories is determined based on a number of the plurality of cores and a number of execution modes supported by each core.

* * * * *